US007812520B2

(12) United States Patent
Nomura et al.

(10) Patent No.: US 7,812,520 B2
(45) Date of Patent: Oct. 12, 2010

(54) FULL COLOR DISPLAY BASED ON ORGANIC LIGHT-EMITTING DEVICE

(75) Inventors: Ryoji Nomura, Yamato (JP); Hiroko Abe, Setagaya (JP); Mikio Yukawa, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 81 days.

(21) Appl. No.: 12/213,135

(22) Filed: Jun. 16, 2008

(65) Prior Publication Data

US 2008/0253420 A1 Oct. 16, 2008

Related U.S. Application Data

(62) Division of application No. 10/879,489, filed on Jun. 30, 2004, now abandoned.

(30) Foreign Application Priority Data

Jul. 1, 2003 (JP) ............................. 2003-189914

(51) Int. Cl.
*H01J 63/04* (2006.01)
*H01S 5/00* (2006.01)
(52) U.S. Cl. .................................. 313/504; 372/50.121
(58) Field of Classification Search ................. 313/504; 372/50.121
See application file for complete search history.

(56) References Cited

U.S. PATENT DOCUMENTS 5,334,424 A 8/1994 Hani et al.

5,478,658 A 12/1995 Dodabalapur et al.

(Continued)

FOREIGN PATENT DOCUMENTS

DE          10162783          7/2003

(Continued)

OTHER PUBLICATIONS

Schon.J.H. et al., "An Organic Solid State Injection Laser,", Science, Jul. 28, 2000, vol. 289, pp. 599-601.

(Continued)

*Primary Examiner*—Minsun Harvey
*Assistant Examiner*—Marcia A. Golub
(74) *Attorney, Agent, or Firm*—Eric J. Robinson; Robinson Intellectual Property Law Office, P.C.

(57) ABSTRACT

The conventional light-emitting element formed by an electroluminescent material has a problem due to poor color purity of light emission. Accordingly, it is an object of the present invention to provide a high luminance and high efficiency light-emitting device formed by an organic compound material. The invention provides a light-emitting device in which an organic compound layer that emits light having an emission peak with a half-band width of at most 10 nm upon applying current is interposed between a pair of electrodes is provided. The variation of emission peak intensity depending on a current density can be sorted by two linear regions with different gradients. A region of a sharp gradient is at a higher current density side compared to a region of a slow gradient. TFTs are provided to each pixel in order to perform active matrix driving.

14 Claims, 9 Drawing Sheets

U.S. PATENT DOCUMENTS

| | | | |
|---|---|---|---|
| 5,554,911 A * | 9/1996 | Nakayama et al. | 313/504 |
| 5,682,402 A | 10/1997 | Nakayama et al. | |
| 5,780,174 A | 7/1998 | Tokito et al. | |
| 5,881,089 A | 3/1999 | Berggren et al. | |
| 5,907,160 A | 5/1999 | Wilson et al. | |
| 6,111,902 A | 8/2000 | Kozlov et al. | |
| 6,160,828 A | 12/2000 | Kozlov et al. | |
| 6,208,077 B1 | 3/2001 | Hung | |
| 6,262,441 B1 | 7/2001 | Bohler et al. | |
| 6,330,262 B1 | 12/2001 | Burrows et al. | |
| 6,392,340 B2 * | 5/2002 | Yoneda et al. | 313/506 |
| 6,704,335 B1 | 3/2004 | Koyama et al. | |
| 6,903,506 B2 | 6/2005 | Kita et al. | |
| 6,939,012 B2 | 9/2005 | Cok et al. | |
| 6,949,878 B2 | 9/2005 | Suzuri et al. | |
| 7,098,590 B2 | 8/2006 | Lim et al. | |
| 2002/0009274 A1 | 1/2002 | Gharavi | |
| 2002/0158263 A1 | 10/2002 | Tanaka et al. | |
| 2003/0103537 A1 | 6/2003 | Taniguchi et al. | |
| 2003/0219058 A1 | 11/2003 | Kahen et al. | |
| 2004/0132228 A1 | 7/2004 | Magno et al. | |
| 2004/0160172 A1 | 8/2004 | Tyan et al. | |
| 2004/0190584 A1 | 9/2004 | Spoonhower et al. | |
| 2004/0202893 A1 | 10/2004 | Abe | |
| 2004/0213308 A1 | 10/2004 | Abe et al. | |
| 2005/0025025 A1 | 2/2005 | Nomura et al. | |
| 2005/0037232 A1 | 2/2005 | Tyan et al. | |
| 2005/0047458 A1 | 3/2005 | Nomura et al. | |
| 2005/0058852 A1 | 3/2005 | Tyan et al. | |
| 2005/0073228 A1 | 4/2005 | Tyan et al. | |
| 2005/0084712 A1 | 4/2005 | Kido et al. | |
| 2005/0106415 A1 | 5/2005 | Jarikov et al. | |
| 2005/0249972 A1 | 11/2005 | Hatwar et al. | |

FOREIGN PATENT DOCUMENTS

| | | |
|---|---|---|
| EP | 0683623 | 11/1995 |
| EP | 0878883 | 11/1998 |
| EP | 0 985 952 | 3/2000 |
| EP | 01083776 | 3/2001 |
| EP | 1154676 | 11/2001 |
| EP | 1 289 015 | 3/2003 |
| JP | 61-214492 | 9/1986 |
| JP | 02-174288 | 7/1990 |
| JP | 03-278460 | 12/1991 |
| JP | 05-343183 | 12/1993 |
| JP | 08-250786 | 9/1996 |
| JP | 2824411 | 11/1998 |
| JP | 10-321941 | 12/1998 |
| JP | 2000-058259 | 2/2000 |
| JP | 2001-071558 | 3/2001 |
| JP | 2001-244080 | 9/2001 |
| JP | 2001-338761 | 12/2001 |
| JP | 2002-359076 | 12/2002 |
| JP | 2003-109757 | 4/2003 |
| JP | 2003-151769 | 5/2003 |
| JP | 2003-168567 | 6/2003 |
| WO | WO-98/50989 | 11/1998 |
| WO | WO 99/49358 | 9/1999 |
| WO | WO-00/36664 | 6/2000 |
| WO | WO-01/39554 | 5/2001 |
| WO | WO-02/071557 | 9/2002 |

OTHER PUBLICATIONS

O'Brien.D et al., "Improved Energy Transfer in Electrophosphorescent Devices,", Appl. Phys. Lett. (Applied Physics Letters), Jan. 18, 1999, vol. 74, No. 3, pp. 442-444.

Tessler.N, "Lasers Based on Semiconducting Organic Materials,", Adv. Mater. (Advanced Materials), 1999, vol. 11, No. 5, pp. 363-370.

International Search Report (Application No. PCT/JP2004/008810; PCT7218) Dated Oct. 5, 2004.

Written Opinion (Application No. PCT/JP2004/008810; PCT7218) Dated Oct. 5, 2004 (In Partial Translation).

Holmes.R et al., "Blue Organic Electrophosphorescence Using Exothermic Host-Guest Energy Transfer,", Appl. Phys. Lett. (Applied Physics Letters), Apr. 14, 2003, vol. 82, No. 15, pp. 2422-2424.

Ng.Kwok K, Complete Guide to Semiconductor Device, 2002, vol. Second Edition, pp. 412-413, John Wiley & Sons.

Coldren.L.A. et al., Diode Lasers and Photonic Integrated Circuits, 1995, pp. 37-44, John Wiley & Sons.

Chen.F et al., "Triplet Exciton Confinement in Phosphorescent Polymer Light-Emitting Diodes,", Appl. Phys. Lett. (Applied Physics Letters), Feb. 17, 2003, vol. 82, No. 7, pp. 1006-1008.

Baldo.M et al., "Prospects for Electrically Pumped Organic Lasers,", Phys. Rev. B (Physical Review. B), Jul. 1, 2002, vol. 66, pp. 035321-1-16.

Kozlov.V et al., "Study of Lasing Action Based on Forster Energy Transfer in Optically Pumped Organic Semiconductor Thin Films,", J. Appl. Phys. (Journal of Applied Physics), Oct. 15, 1998, vol. 84, No. 8, pp. 4096-4108.

Search Report (Application No. 04746279.1; PCTEP7218 Dated Oct. 5, 2006).

Phosphorescent Material Makes Fluorescent OLEDs More Efficient, http://optics.org/cws/article/research/8446, Feb. 18, 2000, OPTICS.ORG.

* cited by examiner

FULL COLOR DISPLAY BASED ON ORGANIC LIGHT-EMITTING DEVICE

BACKGROUND OF THE INVENTION

1. Field of the Invention

This invention relates to a light-emitting device including an organic compound material as a light emitting medium used for displaying images, a lighting, and the like.

2. Related Art

As a light-emitting device available in full color image display by arranging a plurality of light-emitting pixels in a matrix configuration (rows and columns), a light-emitting device available in full color display by combining electroluminescent (EL) elements, each of which emits light in different emission color (typically, red (R), green (G), and blue (B)) per pixel is well known. However, there has been a problem that emission lifetime varies by emission color. Further, there has been a problem that a precision technique for patterning is required.

As another method, a method of combining a blue light-emitting element and a color conversion layer can be nominated. There has been also a problem that high practical color conversion efficiency cannot be obtained according to this method. In addition, it has been problematic that a high efficiency blue light-emitting element has been required.

There is also a method that a white light-emitting element and a color filter are combined; however, there has been a problem that the usability of light emission is deteriorated, and so a high luminance white light-emitting element is required.

SUMMARY OF THE INVENTION

The problem in the above mentioned conventional techniques is caused by poor color purity of light emission of a light-emitting element formed by an electroluminescent material. In view of the foregoing, it is an object of the present invention to provide a high luminance and high efficiency light-emitting device formed by organic compound materials.

The present invention is to provide a light-emitting device having a feature that an organic compound material is used as a light emitting medium, and coherent light and non coherent light from the organic compound material, in other words, luminescence and laser light are coupled out simultaneously or respectively. According to the invention, a material that produces electroluminescence is used. In order to emit laser light in addition to the electroluminescence, a plurality of different organic compound materials is used to be stacked in consideration of the wavelength. The thickness of each layer and the lamination configuration are determined for different purposes.

As used in the following, the term "organic compound layer" is a generic term used to refer to a thin film containing mainly organic compounds interposed between a pair of electrodes. An organic compound layer is formed to be interposed between a pair of electrodes. An organic compound layer is preferably formed by a plurality of layers, each of which has different carrier transportation properties. Moreover, a light-emitting layer is included in the organic compound layer. An organic compound layer is preferably formed to have a resonator structure interposed between reflective layers.

In a light-emitting device according to the present invention, a plurality of layers are stacked as an organic compound layer so as to emit both coherent light and non coherent light by applying current through the organic compound layer interposed between a pair of electrodes.

The light-emitting device is preferably formed to have a so-called resonator structure, in which a reflector is provided to either or both of surfaces of the organic compound layer inside the pair of electrodes. That is, a reflector is preferably provided to either or both of surfaces of the organic compound layer inside the pair of electrodes so that a stationary wave is produced with respect to light at a specified wavelength emitted from the organic compound layer. Moreover, the organic compound layer is preferably formed to have a thickness of ½ time as a wavelength of laser oscillation (half wavelength) or integral multiple of the same.

A light-emitting device used in the invention has a plurality of emission peaks. In the light-emitting device, an organic compound layer emitting light having an emission peak with a half-band width of at most 10 nm is interposed between a pair of electrodes.

Further, the light-emitting device is preferably formed to have a so-called resonator structure, in which a reflector is provided to either or both of surfaces of the organic compound layer inside the pair of electrodes. That is, a reflector is preferably provided to either or both of surfaces of the organic compound layer inside the pair of electrodes so that a stationary wave is produced with respect to light at the wavelength determined by the film thickness. Moreover, the organic compound layer is preferably formed to have a thickness of ½ time of a wavelength of laser oscillation, that is, half wavelength, or integral multiple of the same.

An organic compound layer used in the invention has the configuration composed of a hole injecting layer, a hole transporting layer, a light-emitting layer, an electron transporting layer, an electron injecting layer, and the like. A material having hole transportation properties such as hole mobility is referred to a hole injecting layer or a hole transporting layer. A material having electron transportation properties such as electron mobility is referred to as an electron injecting layer. Though the hole transporting layer and the hole injecting layer are described respectively, they are the same in terms that they have the common property of hole transportation as most important property. As a matter of convenience, a layer adjacent to an anode is referred to as a hole injecting layer, and a layer adjacent to a light-emitting layer is referred to as a hole transporting layer. Further, a layer adjacent to a cathode is referred to as an electron injecting layer, a layer adjacent to a light-emitting layer is referred to as an electron transporting layer. The light-emitting layer may serve as the electron transporting layer, and so it can be referred to as a light-emitting electron transporting layer. In addition, the light-emitting layer may serve as a hole injecting layer, a hole transporting layer, an electron injecting layer, an electron transporting layer, and the like. Further, the light-emitting layer can be formed by metal complexes, organic dye materials, various derivatives, or the like in order to vary emission color.

In a lamination configuration of such an organic compound layer, electrons injected from a cathode and holes injected from an anode are recombined to form an exciton in the light-emitting layer, and the exciton radiates light while they are back to the ground state. Light emission is obtained by so-called electroluminescence from the exciton. In a light-emitting device according to the invention, a hole transporting layer is formed on a light-emitting layer so as to emit light having an emission peak with a half-band width of at most 10 nm at a central wavelength in a shorter wavelength side than a wavelength band of the light that is generated in the light-emitting layer upon applying current. Thus, it is possible to induce laser light.

The invention is to provide a light-emitting device in which an organic compound layer that emits light having an emission peak with a half-band width of at most 10 nm upon applying current is interposed between a pair of electrodes. The variation of emission peak intensity depending on a current density can be sorted by two linear regions with different gradients. A region of a sharp gradient is at a higher current density side compared to a region of a slow gradient in the two linear regions with different gradients.

The invention is to provide a light-emitting device in which light-emitting elements provided with the above mentioned organic compound layer are arranged in a matrix configuration to form a pixel portion, and transistors for controlling light generated in the light-emitting elements are connected to the light-emitting elements.

According to the invention, a high luminance and high efficiency light-emitting device can be provided that couples out coherent light and non coherent light, in other words, luminescence and laser light in order to utilize the out-coupled light.

These and other objects, features and advantages of the present invention will become more apparent upon reading of the following detailed description along with the accompanied drawings.

BRIEF DESCRIPTION OF THE DRAWINGS

FIG. 1A is a perspective view.

DESCRIPTION OF THE INVENTION

Embodiment Mode

Embodiment Mode of the invention is a light-emitting device in which an organic compound layer having a plurality of emission peaks is interposed between a pair of electrodes. One feature of the light-emitting device is producing light emission having at least one emission peak with a half-band width of at most 10 nm. An emission peak with a narrow half-band width can be realized by utilizing an organic compound material and a lamination configuration as follows.

In an organic electroluminescent element, a large number of carriers are supplied to an organic thin film. When applying current, the number of carriers presented in the element and the number of molecules presented in the element becomes approximately the same, or the number of carriers becomes larger than that of molecules. Therefore, the number of molecules with no carriers, that is, the number of molecules in a ground state, is smaller than that of molecules with carriers. When an excitation state is produced due to carrier recombination in this state, it becomes possible to create the state that the number of molecules in the excitation state is relatively larger than that of molecules in a ground state. Hence, it can be expected that population inversion can be sufficiently produced by applying a small amount of current. When the thickness of an organic film serving as a resonator for the element is formed to be integral multiple of a half wavelength, it can be expected that laser oscillation can be realized by light amplification due to induced radiation and resonation generated from the state of population inversion.

Figure 4:
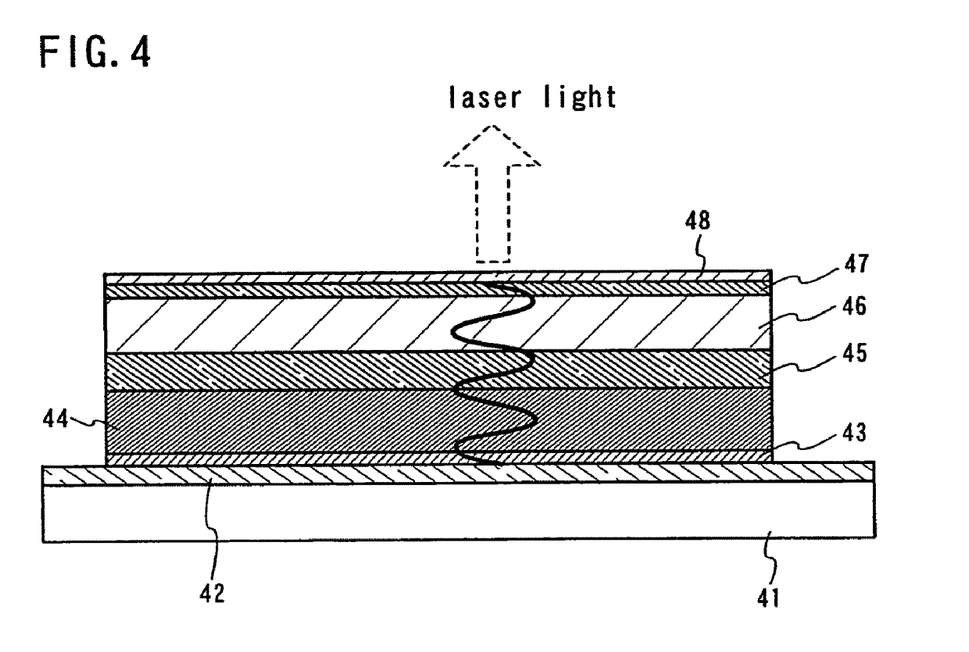
FIG. 4 is an explanatory cross-sectional view for showing a structure of a light-emitting device according to Embodiment mode of the invention.

FIG. 4 shows a structure of a top emission type light-emitting element in which laser light is emitted from a top surface of a substrate. In FIG. 4, reference numeral 41 denotes a substrate, which is formed by any materials. For example, not only glass, quartz, plastic, but also a flexible substrate such as paper or cloth can be used. Of course, the substrate is not required to be transparent.

An anode 42 has a function of injecting holes to an organic compound layer. In addition, the anode 42 serves as a reflecting mirror. Therefore, a material that has poor absorption properties of visible light, high reflectivity, and large work functions (at least 4.0 eV) is required. As a material that meets the foregoing conditions, Ag, Pt, Au, or the like can be used. In addition, since the electrode is used as a reflecting mirror, the electrode is required to have the thickness that does not transmit visible light. Specifically, the electrode may be formed to have a thickness of from several ten nm to several hundreds nm.

An organic compound layer which emits light by applying current is formed over the anode 42. Specifically, a hole injecting layer 43, a hole transporting layer 44, a light-emitting layer 45, and an electron transporting layer 46 and an electron injecting layer 47 are formed.

As the hole injecting layer 43, materials having small ionization potential, which are classified broadly into metal oxides, low molecular organic compounds, and high molecular compounds are used. As examples of the metal oxides, vanadium oxides, molybdenum oxides, ruthenium oxides, aluminum oxides, and the like can be used. As examples of the low molecular organic compounds, starburst amine typified by m-MTDATA, metallophthalocyanine, and the like can be used. As examples of the high molecular compounds, conjugated polymer such as polyaniline or polythiophene derivatives can be nominated. By using the foregoing materials as a hole injecting layer, a hole injecting barrier is reduced to inject holes effectively.

As a typical example of the hole transporting layer 44, known materials such as aromatic amine can be preferably used. For example, 4,4'-bis[N-(1-naphthyl)-N-phenyl-amino]-biphenyl (abbreviated α-NPD), 4,4',4"-tris(N,N-diphenyl-amino)-triphenyl amine (abbreviated TDATA), or the like can be used. As high molecular materials, poly(vinyl carbazole) having excellent hole transportation properties can be used.

As the light-emitting layer 45, a metal complex such as tris(8-quinolinolate) aluminum (abbreviated Alq$_3$), tris(4-methyl-8-quinolinolate) aluminum (abbreviated Almq$_3$), bis (10-hydroxybenzo[η]-quinolinato) beryllium (abbreviated BeBq$_2$), bis(2-methyl-8-quinolinolate)-(4-hydroxy-biphenylyl)-aluminum (abbreviated BAlq), bis [2-(2-hydroxyphenyl)-benzooxazolate] zinc (abbreviated Zn(BOX)$_2$), bis [2-(2-hydroxyphenyl)-benzothiazolate] zinc (abbreviated Zn(BTZ)$_2$), or the like can be used. Alternatively, various types of fluorescent dye can be used. Further, phosphorescent materials such as a platinum octaethylporphyrin complex, a tris(phenylpyridine)iridium complex, or a tris(benzylideneacetonato)phenanthrene europium complex can be efficiently used. Since phosphorescent materials have longer excitation lifetime than that of fluorescent materials, population inversion, that is, the state in which the number of molecules in an excited state is larger that that in a ground state, becomes to be formed easily, which is essential to laser oscillation.

In addition, light-emitting materials can be used as dopant in the foregoing light-emitting layer. Therefore, a material having larger ionization potential and band gap than those of the light-emitting material can be used as a host material, and a small amount of the foregoing light-emitting material (approximately from 0.001 to 30%) can be mixed into the host material.

As the electron transporting layer 46, a metal complex having a quinoline skeleton or a benzoquinoline skeleton, or a mixed ligand complex thereof typified by tris(8-quinolinolate)aluminum (abbreviated Alq$_3$) is preferably used. Alternatively, an oxadiazole derivative such as 2-(4-biphenyl)-5-(4-tert-butylphenyl)-1,3,4-oxadiazole (abbreviated PBD), or 1,3-bis[5-(p-tert-butylphenyl)-1,3,4-oxadiazole-2-yl]benzene (abbreviated OXD-7), a triazole derivative such as 3-(4-tert-butylphenyl)-4-phenyl-5-(4-biphenylyl)-1,2,4-triazole (abbreviated TAZ), or 3-(4-tert-butylphenyl)-4-(4-ethylphenyl)-5-(4-biphenylyl)-1,2,4-triazole (abbreviated p-EtTAZ), phenanthroline derivatives such as bathophenanthroline (abbreviated BPhen), or bathocuproin (abbreviated BCP) can be used.

As the electron injecting layer 47, an alkali metal or alkaline earth metal salt such as calcium fluoride, lithium fluoride, or cesium bromide can be used. The cathode 48 is formed thereover. The cathode 48 may be formed by a metal having small work functions, an alloy, an electrical conductive compound, and mixture of the foregoing materials, each of which is used for the general organic electroluminescent elements. As specific examples of the cathode material, an element of group 1 or 2 in the periodic table, that is, an alkali metal such as Li, Cs, or the like; alkali earth metal such as Mg, Ca, Sr, or the like; an alloy containing the foregoing materials (Mg/Ag, Al/Li); or a transition metal containing a rare earth metal can be used. Alternatively, the cathode 48 can be formed by stacking a metal such as Al, Ag, or ITO (including alloys) with the foregoing materials. In addition, a resonator structure is required between the anode and the reflector over the cathode in order to resonate light emission obtained from a light-emitting layer in this embodiment mode. Therefore, as a cathode material, a metal having poor absorption of visible light and high reflectance is preferably used. Specifically, Al, Mg, or an alloy of Al or Mg is preferably used.

The foregoing organic materials can be applied with either wet or dry process. In case of using high molecular materials, spin coating, ink jetting, dip coating, printing, or the like can be appropriately used. On the other hand, in case of using low molecular materials, not only dip coating or spin coating, but also vapor deposition can be used. The anode material and the cathode material may be applied with vapor deposition, sputtering, or the like.

The most important thing is an interval between the cathode and the reflecting mirror over the anode. The interval is required to be integral multiple of a half wavelength for forming a stationary wave to amplify light. For example, in order to amplify light at 400 nm, an interval at least 200 nm is required. Similarly, in order to amplify light at 800 nm, an interval of 400 nm is required. The emission wavelength of the foregoing organic light-emitting materials is mainly in a visible light region. Therefore, in order to amplify the visible light defined as from 400 to 800 nm, the interval between the reflector mirror and the cathode 48, that is, the thickness of a functional layer is required to have a thickness of at least 200 nm. In addition, since it should consider that light speed is less for the refraction index of a material, it is required that the value obtained by multiplying the thickness by refraction index is at least 200 nm.

The cathode 48 is formed to have transmittance of from 50 to 95% for the wavelength of laser oscillation. The cathode 48 may be formed to have a thickness of from 5 to 20 nm in case of being formed by MgAg alloys. Alternatively, MgAg alloys having excellent electron injection properties can be stacked directly instead of forming the electron injecting layer 47. In this instance, since laser light is emitted from a top surface, the cathode 48 serves as an output mirror. Accordingly, the cathode is formed to have transmittance of from 50 to 95% for the wavelength of laser oscillation. For example, an MgAg alloy is formed to have a thickness of from 5 to 20 nm.

Figure 5:
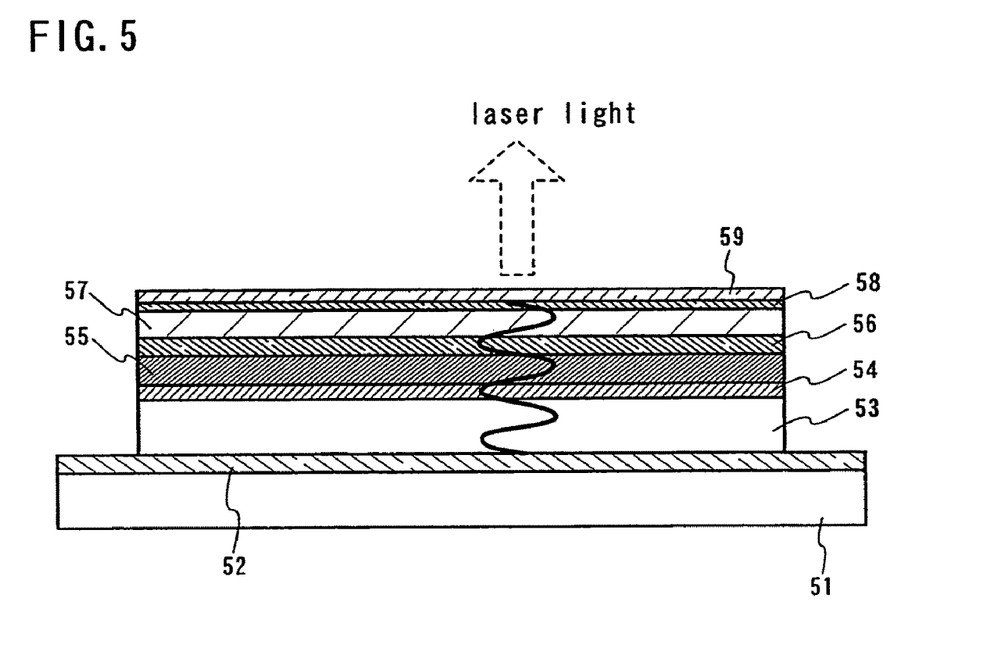
FIG. 5 is an explanatory cross-sectional view for showing a structure of a light-emitting device according to Embodiment mode of the invention.

FIG. 5 shows the state that a reflecting mirror is located over the underside of a transparent electrode. Therefore, the thickness of an organic compound layer can be reduced and laser light can be oscillated from the top surface of a substrate by the structure in which the transparent electrode is incorporated into a part of a resonator.

In FIG. 5, a substrate 51 can be formed by any materials. For example, not only glass, quartz, plastic, but also a flexible substrate such as paper or cloth can be used. Of course, the substrate is not required to be transparent. A reflecting mirror 52 is provided over the substrate 51. As the reflecting mirror 52, a material that has high reflectivity and poor absorption properties for visible light is selected. Specifically, metals such as Al, Ag, or the like; alloys containing mainly the foregoing metals; or a laminated film of derivatives such as SiO$_2$, TiO$_2$, or the like can be used. In a derivative laminated film, the thickness of each layer is determined so as to reflect selectively light with an oscillation wavelength. The derivative laminated film is formed by stacking some layers required for total reflection. An electrode 53 is formed over the reflecting mirror 52. The electrode 53 is required to inject holes to an organic compound layer and have high transparency. For the electrode 53, a transparent electrode such as ITO, TiN, or the like is preferably used.

Over the electrode 53, the same structure as that of an organic electroluminescent element that emits light upon applying current. That is, a hole injecting layer 54, a hole transporting layer 55, a light-emitting layer 56, and an electron transporting layer 57 are formed. These layers may be formed by the foregoing materials. In the hole injecting layer 54, the hole transporting layer 55 and the electron transporting layer 57, a layer that does not contribute light emission is not necessarily formed. The electron injecting layer 58 is generally formed over the electron transporting layer 57. An organic compound doped with an alkali metal such as Li, Ce, or the like is preferably used. Thereafter, a cathode 59 is formed. The cathode 59 may be formed by the foregoing materials. Alternatively, MgAg alloys having excellent electron injection properties can be stacked directly instead of forming the electron injecting layer 58. In this instance, since laser light is emitted from a top surface, the cathode 59 serves as an output mirror. Accordingly, the cathode is formed to have transmittance of from 50 to 95% for the wavelength of laser oscillation. For example, an MgAg alloy is formed to have a thickness of from 5 to 20 nm.

By applying current to thus formed light-emitting element, a part of light amplified from the organic compound layer resonates between the cathode and the anode, and a stationary wave is formed. Here, the resonator is formed to have a thickness including the thickness of the transparent electrode. Accordingly, the thickness of the organic compound layer can be reduced. Hence, light can be emitted at low voltage. Accordingly, laser can be oscillated at low voltage and electroluminescence can be emitted simultaneously.

Figure 1A:
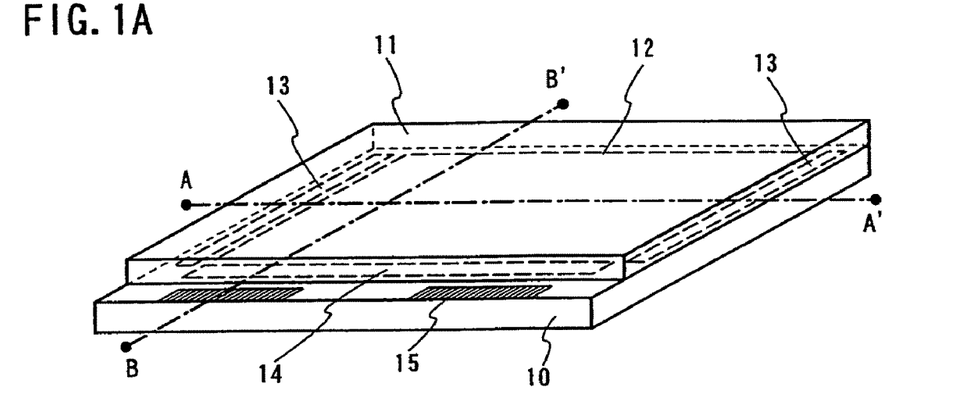
Figure 1B:
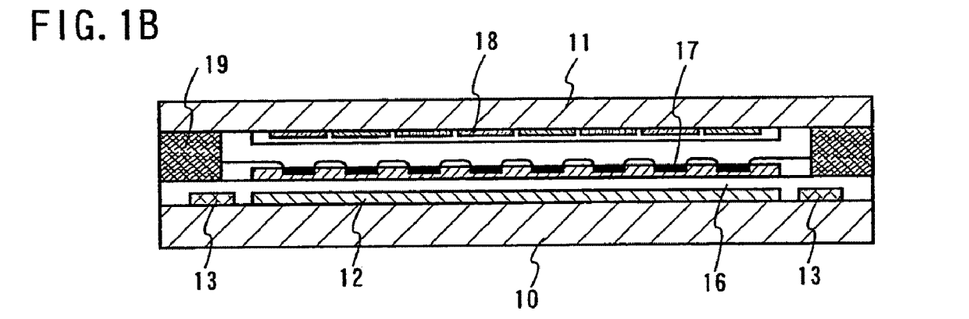
FIGS. 1B and 1C are longitudinal cross-sectional views for showing a structure of a light-emitting device according to Embodiment mode of the present invention.
Figure 1C:
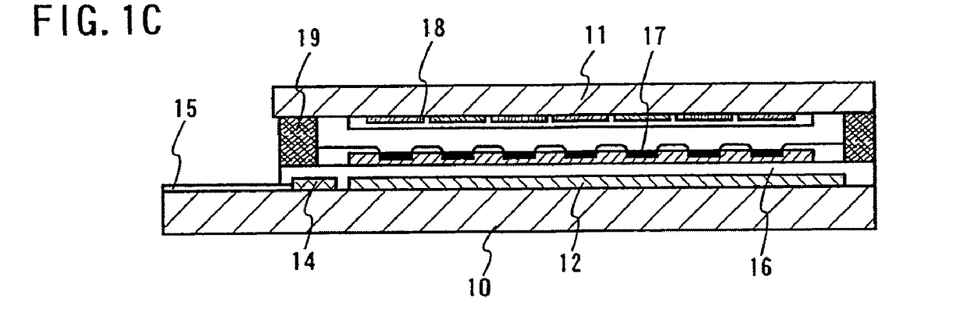

A light-emitting device using the above described light-emitting element is explained with reference to FIGS. 1 and 2. A light-emitting device according to this embodiment mode uses the above described light-emitting element to create a display by using non coherent laser light and coherent laser light due to fluorescence and phosphorescence upon applying an electric field. FIG. 1A is a perspective view for showing the structure of the light-emitting device without an external circuit or the like. FIG. 1B is a cross-sectional view of FIG. 1A taken along the line A-A'. FIG. 1C is a cross-sectional view of FIG. 1A taken along the line B-B'.

The light-emitting device has a element substrate 10 installed with an image display portion 12, a scanning line drive circuit 13, a data line drive circuit 14, an input terminal unit 15, and the like. The element substrate 10 is fixed to an opposing substrate 11 provided with a color filter 18 by sealing agent 19.

As the element substrate 10, glass, quartz, plastic, semiconductor, or the like is used. As the opposing substrate 11, glass, quartz, plastic, or the like transmitting at least visible light is used as a member. The substrate can be formed into any shape such as a plate, a film, or a sheet in a single layer structure or a laminated layer structure. As glass, a transparent glass such as a commercially available non-alkali glass is preferably used. As a glass substrate, an alkali glass coated with a silicon oxide film can be used. In case of using plastic, polyethylenenaphthalate (PEN), polyethylene terephthalate (PET), polyether sulfone (PES), transparent polyimide, or the like can be used. In addition, transparent ceramic such as transparent alumina or ZnS sintered body can be used.

The sealing agent 19 is formed along with the edge of the opposing substrate 11. The sealing agent 19 is formed to overlap with the scanning line drive circuit 13 and the data line drive circuit 14 via an interlayer insulating film 16. The interlayer insulating film 16 is formed with a flatness surface, and a top surface and a side portion of the interlayer insulating film 16 are formed by silicon nitride or silicon oxynitride. In the image display portion 12, a matrix is formed with data lines and scanning lines extended from the scanning line drive circuit 13 or the data line drive circuit 14. A pixel matrix is composed of a crop of switching elements located appropriately in various places and a crop of light-emitting elements 17 connected electrically to the crop of switching elements. The scanning line drive circuit 13 is driven from both sides of the image display portion 12; however, the scanning line drive circuit 13 may be driven from only either side of the image display portion 12 in case that the problem of signal delay is vanishingly small.

Color filters 18 corresponding to the crop of light-emitting elements 17 capable of displaying multicolor are provided. The color filters 18 are appropriately composed of a filter for transmitting a specified wavelength corresponding to each pixel, a sharp cut filter for cutting a wavelength of at most limited transmittance, and a color correction filter. Alternatively, a color conversion layer can be used with the foregoing filters.

Here, the crop of light-emitting elements 17 is composed of light-emitting elements emitting specific light having at least one emission peak with a half-band width of at most 10 nm. In this instance, a band path filter for specified light and a filter transmitting a specific wavelength as the color filters 18 are located corresponding to each pixel.

The input terminal unit 15 is formed at the periphery of the element substrate 10. The input terminal unit 15 receives various signals from an external circuit and connects to a power source. Space surrounded by the element substrate 10, the opposing substrate 11, and the sealing agent 19 is filled with an inert gas. By filling the inert gas, the crop of light-emitting elements 17 is protected from corrosion. Drying agent such as barium oxide may be provided in the space.

Figure 2:
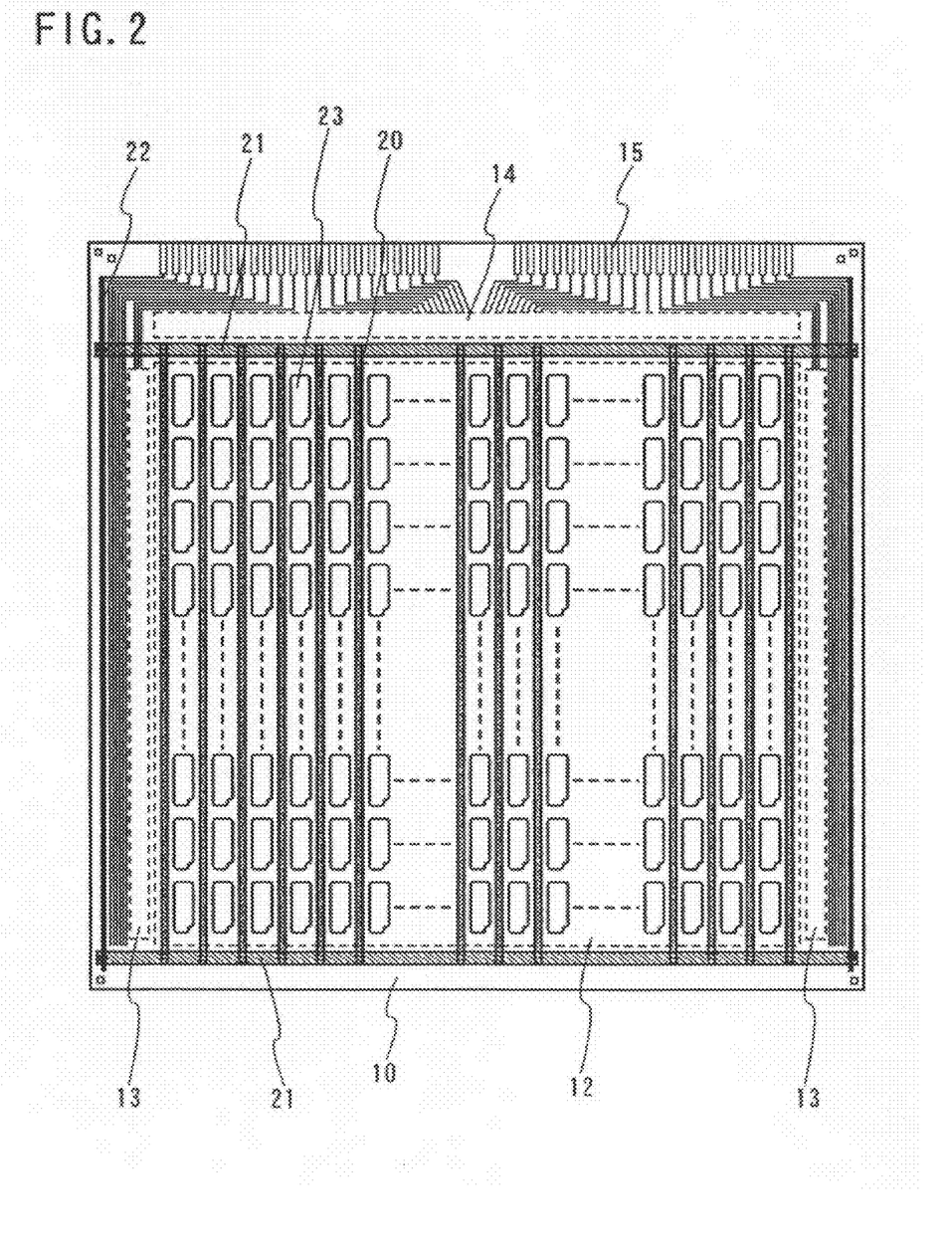
FIG. 2 is an explanatory top view for showing a structure of a light-emitting device according to Embodiment mode of the invention.

FIG. 2 is a top view of the element substrate 10 for showing the structure thereof in detail. The structure of the element substrate 10 shows the arrangement of the scanning line drive circuit 13 enclosing the two sides of the image display portion 12 and the data line drive circuit 14 adjacent to other side of the image display portion 12 and the input terminal unit 15.

In FIG. 2, compartmentalized one pixel region 23 is arranged in rows and in columns to compose the image display portion 12. A first auxiliary wiring 20 is formed in stripe parallel to columns. The both ends or the either end of the first auxiliary wiring 20 is extended to outside of the image pixel portion. The first auxiliary wiring 20 is formed to prevent from overlapping with the one pixel region 23 so as not to interfere with an opening ratio. A second auxiliary wiring 21 connected electrically to the first auxiliary wiring 20 is extended in parallel to rows. The both ends or either end of the second auxiliary wiring 21 connects electrically to a wiring 22 extended from the input terminal unit 15. Constant potential or alternation potential may be applied to the wiring 22 depending on the drive method of the organic electroluminescent element.

The auxiliary wiring is preferably formed by a material having resistivity of at most $1\times10^{-5}$ Ωcm. The value of resistance of the auxiliary wiring per 1 cm is preferably at most 100Ω. Needless to say, the value of resistance of the auxiliary wiring is determined by a line width and a thickness besides a material to be formed. For, example, in case that the pitch between pixel rows is 200 µm, the first auxiliary wiring formed over a bank layer is appropriately formed to have a width of from 20 to 40 µm given that the width of the pixel electrode is approximately 120 µm. In case that the auxiliary wiring is formed by aluminum alloys having resistivity of $4\times10^{-6}$ Ωcm to have a thickness of 0.4 µm, the value of resistance becomes 50Ω per 1 cm when the line width is 20 µm.

Figure 3:
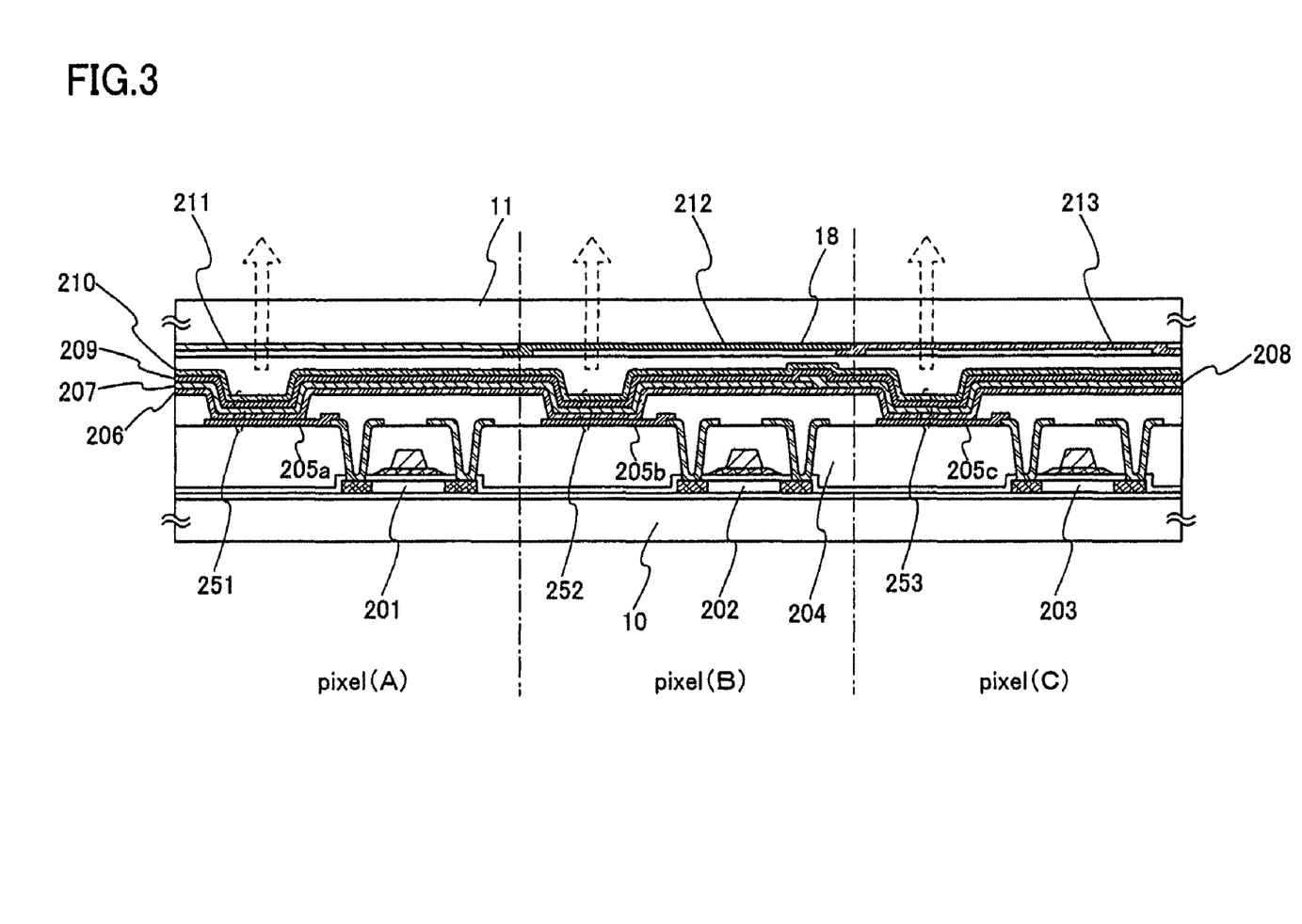
FIG. 3 is an explanatory cross-sectional view for showing a structure of a light-emitting device according to Embodiment mode of the invention.

FIG. 3 is a cross-sectional view showing the structure of a light-emitting device. A pixel (A), a pixel (B), and a pixel (C) are formed over the element substrate 10. A light-emitting element 251 connected to a thin film transistor (hereinafter, TFT) 201 is provided to the pixel (A). A light-emitting element 252 connected to a TFT 202 is provided to the pixel (B). A light-emitting element 253 connected to a TFT 203 is provided to the pixel (C). The TFTs and the light-emitting elements are formed via an interlayer insulating film 204.

Each electrodes 205a to 205c is formed over the interlayer insulating film 204 to connect electrically to the TFT of each pixel.

The light-emitting element is formed to sandwich an organic compound layer between the electrode 205a and other electrode 210. The structure of the organic compound layer can be varied depending on the emission color of each pixel. Other than a light-emitting layer, that is, a hole injecting layer, a hole transporting layer, an electron injecting layer, and an electron transporting layer, may be shared by each pixel.

In FIG. 3, a hole transporting layer 206 and an electron transporting layer 209 are formed by one layer to be shared by each pixel. A light-emitting layer 207 is shared by the pixels (A), (B). A light-emitting layer 208 formed by another material is provided to the pixel (C).

As in the present invention, in case that a light-emitting element that emits light having a plurality of emission peaks and having an emission spectrum distributed throughout a specified wavelength band is used, light can be coupled out selectively by a coloring layer of a color filter 18 provided corresponding to the pixel. A pixel that can couple out coherent light by locating a coloring layer serving as a band path filter can be provided to a light-emitting element capable of emitting non coherent light (electroluminescence) and coherent light (laser light). Therefore, a pixel portion that can display an image by coupling out respectively non coherent light (electroluminescence) and coherent light (laser light) using an optical filter can be provided.

The space between the opposing substrate 11 and the element substrate 10 may be filled with light-transmitting resin or a dried inert gas, or depressurized in order to seal the light-emitting element.

In this embodiment mode, a transistor provided to a pixel is formed by a TFT; however, the invention is not limited thereto. A TFT composed of a MOS transistor formed over a single crystalline semiconductor substrate or a SOI (Silicon On Insulator), or an amorphous semiconductor film such as silicon can be formed.

Embodiment

Figure 6:
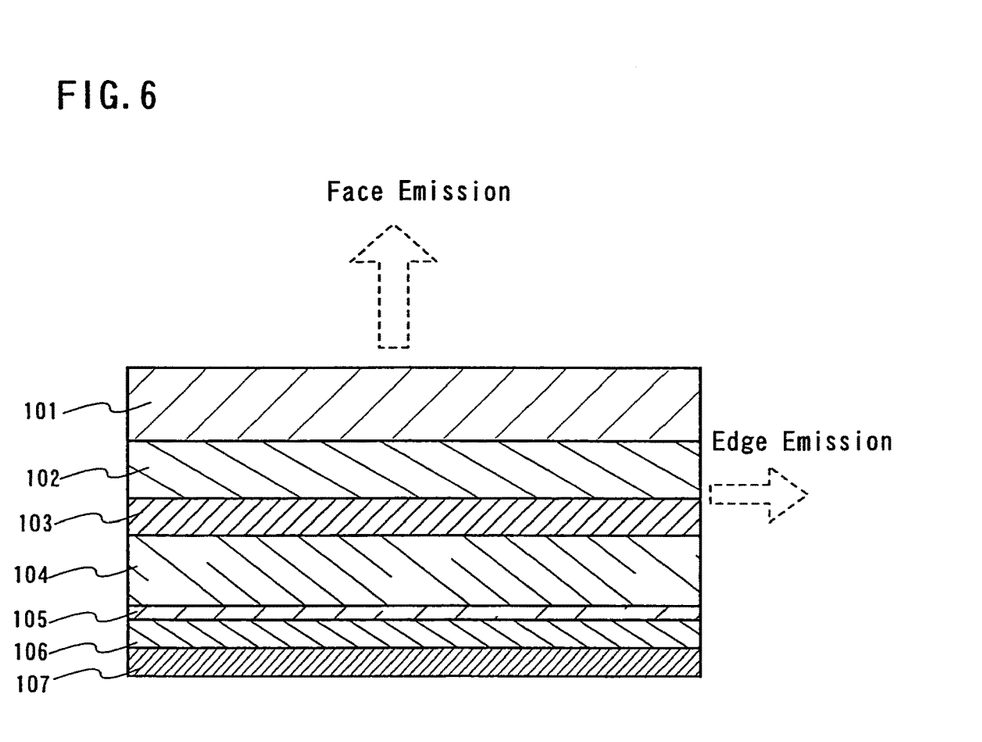
FIG. 6 is an explanatory cross-sectional view for showing a structure of a light-emitting device according to Embodiment of the invention.

Hereinafter, an example of a light-emitting element capable of being applied for the present invention will be explained with reference to FIG. 6.

As a substrate for forming a film such as an electrode or a light-emitting layer, a glass substrate 101 such as commercially available alumino silicate glass, barium borosilicate glass, and the like are preferably used. Over the glass substrate, an ITO film is formed by sputtering to have a thickness of from 30 to 100 nm as the first electrode (anode) 102.

As the hole transporting layer 103, 4,4'-bis[N-(1-naphthyl)-N-phenyl-amino]-biphenyl (NPB) is deposited by vacuum vapor deposition to have a thickness of 135 nm. As the light-emitting layer 104, 4,4'-bis(N-carbazolyl)-biphenyl (CBP) as a host material and an iridium complex, Ir(tpy)$_2$(acac) as a triplet light-emitting material are deposited to have a thickness of 30 nm by co-evaporation. The weight ratio of the CBP and the iridium complex is 10:1. The electron transporting layer 105 is formed thereover by bathocuproin (BCP) to have a thickness of 105 nm. The electron injecting layer 106 is formed by calcium fluoride (CaF$_2$). The second electrode 107 is formed by Al (aluminum) by vapor deposition.

The film thickness of each layer formed by organic materials is determined so as to amplify light generated in an organic compound layer. Therefore, the light emission from the Ir complex, which is added to the light-emitting layer 104, or the light emission from the hole transporting layer 103 preferably form a stationary wave by repeating reflection at the interface between the first electrode 102 and the hole transporting layer 103, the interface between the electron transporting layer 105 and the electron injecting layer 106, or the interface between the electron injecting layer 106 and the second electrode 107.

Materials capable of emitting light are the Ir complex and the NPB in the organic compound materials used here. These materials give light emission in a visible light region (400 to 800 nm). In order to form a stationary wave, the intervals between reflective surfaces are required to be the integral multiple of a half wavelength. For example, in order to form a stationary wave of 400 nm, the intervals are required to be 200 nm or the integral multiple thereof. That is, the thicknesses are required to be integral multiple of 200 nm, such as 200, 400, or 600 nm. Similarly, in order to form a stationary wave of light at 800 nm, the intervals between the reflective surfaces, that is, the thicknesses are required to be integral multiple of 400 nm, such as 400, 800, or 1200 nm.

By way of embodiment, the hole transporting layer 103 is formed to have a thickness of 135 nm, the light-emitting layer 104 is formed to have a thickness of 30 nm, and the electron transporting layer 105 is formed to have a thickness of 105 nm. As a result, the organic compound layer is formed to have a thickness of 270 nm in total. In this case, given that the refractive index of organic compound layer is 1.7, the wavelength of light capable of forming a stationary wave is the one that is divided 920 nm by integer, that is, 460 nm in a visible light region.

Figure 7A:
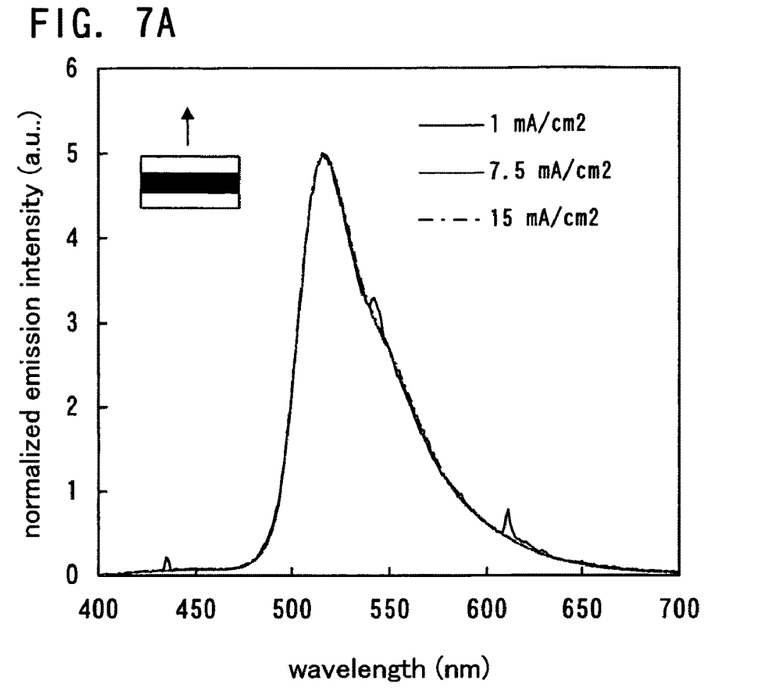
FIGS. 7A and 7B are graphs for showing a current density dependency, which is normalized by a maximum value of emission intensity, of emission spectra of a light-emitting element manufactured according to Embodiment.
Figure 7B:
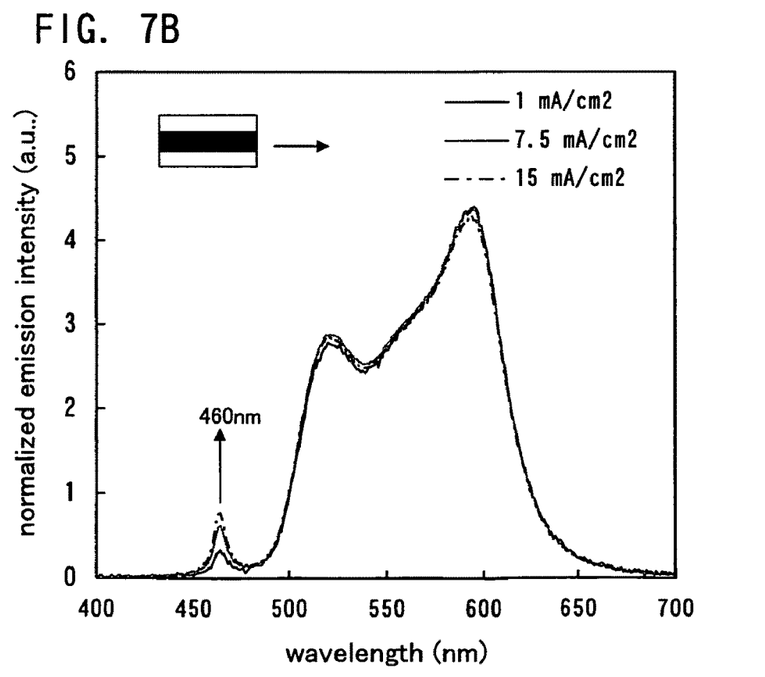

FIGS. 7A and 7B show an emission spectrum of a thus obtained light-emitting element. Light emission is obtained by applying direct voltage to a pair of electrodes with the first electrode serving as an anode and the second electrode serving as a cathode. Light emission can be observed at an applied voltage of around 6 V. Light emission of tens of thousands candela (Cd) is obtained at an applied voltage of 24 V.

In both spectra shown in FIGS. 7A and 7B, normalized emission intensity is shown. FIG. 7A shows an emission spectrum of a face emission observed from the side of the first electrode. FIG. 7B shows an emission spectrum of an edge emission observed from a lateral side of the substrate provided with a laminated organic compound layer. As shown in FIG. 7A, intense emission is observed in a wavelength band of from 475 to 650 nm. The emission is produced from the Ir complex. Another emission is observed at around 400 to 475 nm. The emission is produced from the NPB.

The measurement shows that carriers (holes and electrons) are recombined each other almost always in the light-emitting layer 104 to excite the light emission from the Ir complex; however, some carriers are recombined in the hole transporting layer 103. In case of the face emission, emission intensity varies depending on the variation of a current density. Therefore, the spectra at any current density become to have identical forms, and only the intensity is increased linearly in proportion to the increase of a current density.

Compared to the spectrum shown in FIG. 7A, the spectrum of the edge emission has two features. The first feature is that the waveform of an emission spectrum in the wavelength band of from 475 to 650 nm is different from that in FIG. 7A. The second feature is that a sharp emission spectrum is observed around 460 nm in FIG. 7B. The reason of the former is not clear. On the contrary, the reason of the latter may be considered that a stationary wave is formed by the organic compound layer 102, and only the light emission at the wavelength is amplified. Actually, as mentioned above, the wavelength which allows stationary wave is 460 nm in the organic compound layer 102 with the thickness. As the most characteristic feature, the intensity of the emission in the wavelength band of from 475 to 600 nm varies in proportion to the increase of a current density, on the contrary, the intensity of another emission spectrum having a peak at around 460 nm further increases than the increase of a current density. Therefore, in the normalized intensity shown in FIG. 7B, only emission at 460 nm is relatively increased.

Figure 8:
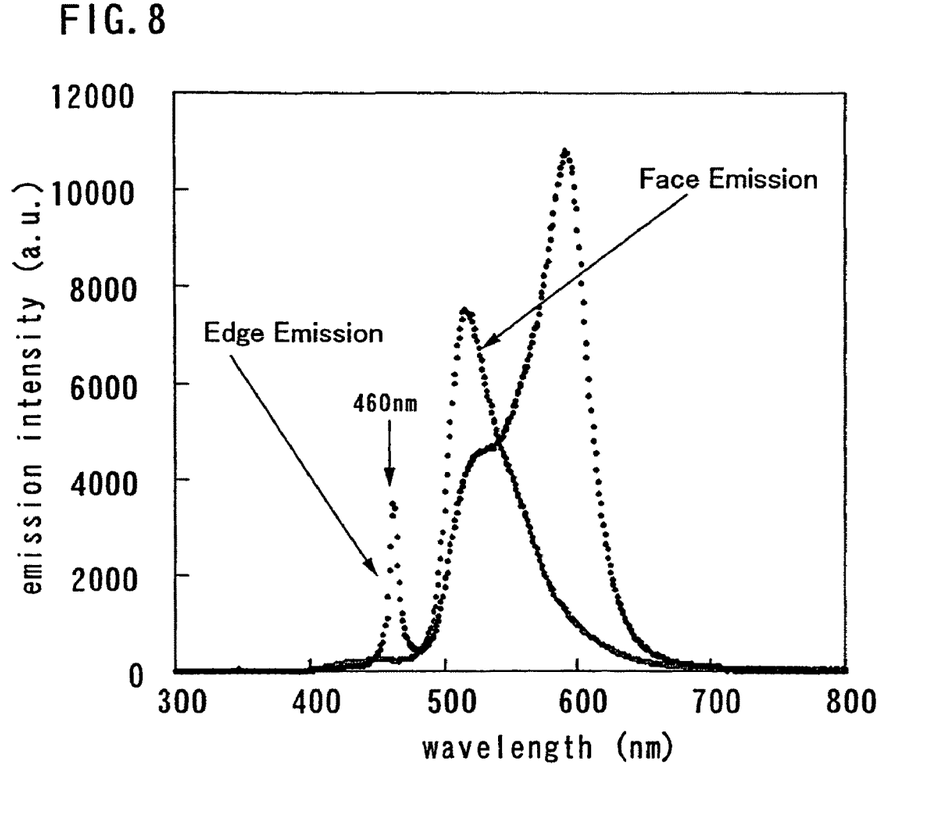
FIG. 8 is a graph for showing an emission spectrum at current density of 120 mA/cm$^2$ of a light-emitting element manufactured according to Embodiment.

Therefore, the measurement shows that the structure of the light-emitting device serves as a resonator of light at 460 nm to amplify the light. FIG. 8 shows a result of increasing a current density. As shown in FIG. 8, a spectrum shape of face emission is not varied at all at a current density of 120 mA/cm$^2$. On the contrary, the intensity of edge emission is increased at 460 nm; therefore sharp emission intensity is obtained.

Table 1 shows laser oscillation characteristics of a sample manufactured according to Embodiment. Table 1 is the measurement result of the sample in three pieces showing a peak wavelength of from 462 to 464 nm, a half-band width of at most 10 nm, and a threshold of from 10 to 12.5 mA/cm$^2$ and presenting a good repeatability. These characteristics are measured at room temperature.

TABLE 1

| sample No. | threshold (mA/cm$^2$) | peak wavelength (nm) | half-band width[1] (nm) |
|---|---|---|---|
| 1 | 12.5 | 464 | 8.0 |
| 2 | 10.0 | 462 | 8.0[2] |
| 3 | 11.0 | 463 | 9.1 |

[1]half-band width of 50 mA/cm$^2$,
[2]half-band width of 60 mA/cm$^2$

Accordingly, the light-emitting device has a resonator structure for light emission around 460 nm to form a stationary wave of light at the wavelength. Further, light emission of 460 nm denotes threshold to a current density. The behavior is similar to that of a solid laser. In case that the threshold indicates that what is called population inversion is started, laser light is oscillated at a further large current density.

The invention can be practiced by utilizing another lamination structure formed by another material, in case that the invention is not limited to the foregoing structure of the light-emitting element, and that electroluminescence and laser light can be coupled out simultaneously or respectively.

In a light-emitting device according to the invention shown in FIG. 3, the case that a light-emitting element according to this embodiment will be explained. A light-emitting layer 207 is shared by a light-emitting elements 251, 252 to use an organic compound layer according to this embodiment. When a coloring layer 211 is formed by a blue filter corresponding to the light-emitting element 251, laser light having an emission peak at 460 nm. A coloring layer 212 is formed by a green filter for the light-emitting element 252. In a light-emitting element 253, a light-emitting layer 208 is formed into a red light-emitting layer by using different materials and by doping red emission dye into Alq$_3$ or TPD. The color purity of emission color of the light-emitting element 253 can be improved by using a red color filter as a coloring layer 213. A blue filter may be used as a coloring layer 211 for the light-emitting element 251. A blue cut filter may be used as a coloring layer 212 for the light-emitting element 252.

Accordingly, a light-emitting device available in full color display (red (R), green (G), blue (B)) can be thus manufactured.

Various electric appliances can be completed by using the above mentioned light-emitting device according to the invention, such as a personal digital assistant (an electronic book, a mobile computer, a cellular phone, and the like), video camera, digital camera, computer, a liquid crystal TV set, cellular phone, and the like.

Figure 9A:
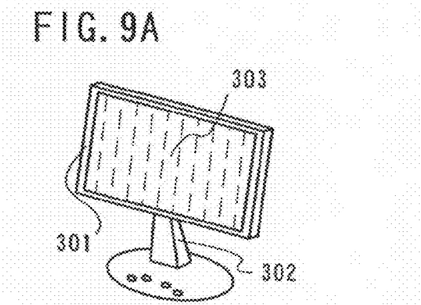
FIGS. 9A to 9G are views for showing examples of electric appliances completed by using a light-emitting device according to the invention.

FIG. 9A illustrates an example of a TV set applied with the invention composed of a housing 301, a support 302, a display portion 303, and the like. The TV set can be completed by using a light-emitting device according to the invention as a display portion 303.

Figure 9B:
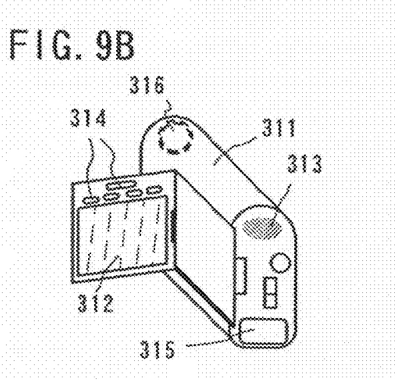

FIG. 9B illustrates an example of a video camera applied with the invention composed of a main body 311, a display portion 312, a sound input unit 313, operation switches 314, a battery 315, an image reception portion 316, and the like. The video camera can be completed by using a light-emitting device according to the invention as a display portion 312.

Figure 9C:
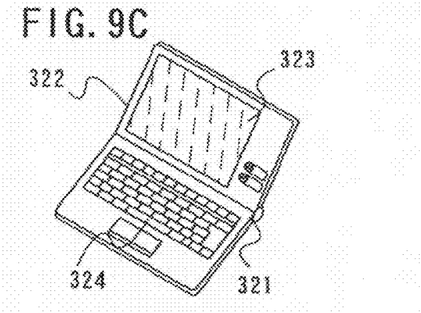

FIG. 9C illustrates an example of a computer applied with the invention composed of a main body 321, a housing 322, a display portion 323, a key board 324, and the like. The computer can be completed by using a light-emitting device according to the invention as a display portion 323.

Figure 9D:
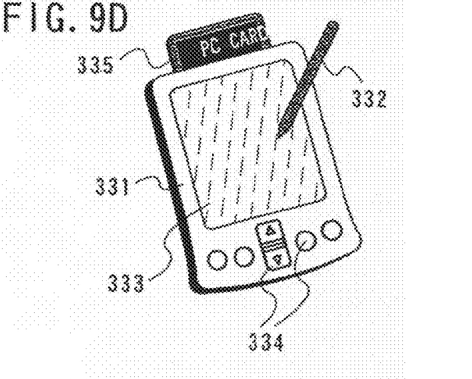

FIG. 9D illustrates an example of a PDA (Personal Digital Assistant) applied with the invention composed of a main body 331, a stylus 332, a display portion 333, operation buttons 334, an external interface 335, and the like. The PDA can be completed by using a light-emitting device according to the invention as a display portion 333.

Figure 9E:
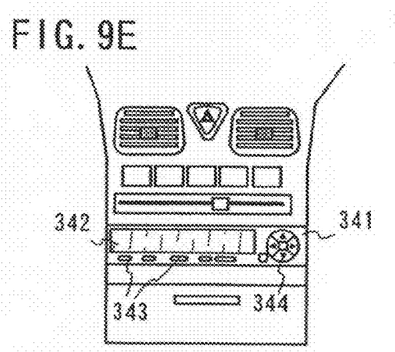

FIG. 9E illustrates an example of a sound reproduction device applied with the invention, in specific, an in-car audio system composed of a main body 341, a display portion 342, operation switches 343, 344, and the like. The sound reproduction device can be completed by using a light-emitting device according to the invention as a display portion 342.

Figure 9F:
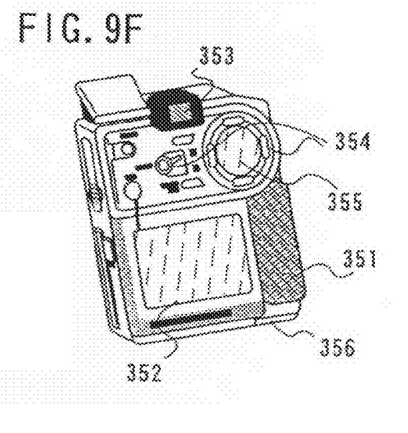

FIG. 9F illustrates an example of a digital camera applied with the invention composed of a main body 351, a display portion (A) 352, an eye-piece portion 353, operation switches 354, a display portion (B) 355, a battery 356, and the like. The digital camera can be completed by using a light-emitting device according to the invention as display portions 352, 355.

Figure 9G:
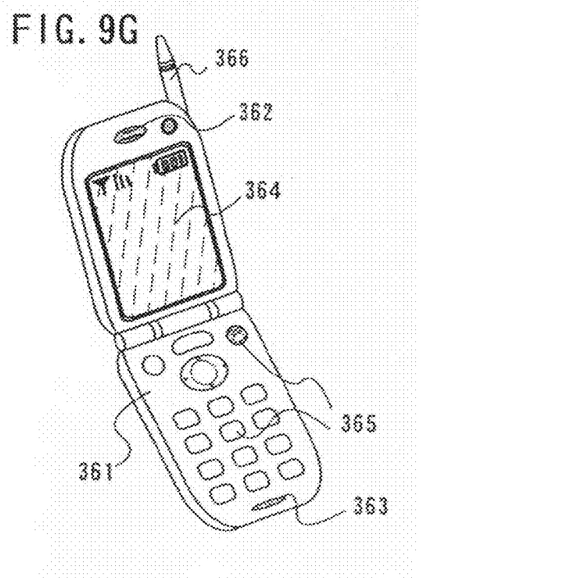

FIG. 9G illustrates an example of a cellular phone applied with the invention composed of a main body 361, a sound output portion 362, a sound input portion 363, a display portion 364, operation switches 365, an antenna 366, and the like. The cellular phone can be completed by using a light-emitting device according to the invention as the display portion 364.

These electric appliances are illustrative only. A light-emitting device according to the invention is not limited thereto, but can be used as a means for displaying images in a washing machine, a refrigerator, a land line, a game machine, a microwave oven, a radio, and the like.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A light-emitting device comprising:
    a first light emitting element comprising a first light emitting layer interposed between a first pair of electrodes;
    a second light emitting element comprising the first light emitting layer interposed between a second pair of electrodes;
    a third light emitting element comprising a second light emitting layer interposed between a third pair of electrodes; and
    a first coloring layer, a second coloring layer, and a third coloring layer provided over the first light emitting element, the second light emitting element, and the third light emitting element, respectively;

wherein the second light emitting element is adjacent to the first light emitting element and the third light emitting element;

wherein the first light emitting layer extends from the first light emitting element to the second light emitting element and is shared by the first light emitting element and the second light emitting element;

wherein the first coloring layer, the second coloring layer, and the third coloring layer are different in color from each other, wherein the first light emitting layer and the second light emitting layer are different in emission color from each other, and wherein the second light emitting layer overlaps an edge portion of the first light emitting layer.

2. A light-emitting device according to claim 1,
wherein the first light emitting element further comprises a hole transporting layer and an electron transporting layer with the first light emitting layer therebetween, and
wherein a total thickness of the hole transporting layer, the first light-emitting layer and the electron transporting layer is arranged to be equal to an integral multiple of a value that is obtained by dividing a wavelength of an emission peak of the hole transporting layer by refraction index of a layer consisting of the hole transporting layer, the first light emitting layer, and the electron transporting layer.

3. A light-emitting device according to claim 1,
wherein the first light emitting element is capable of emitting laser light.

4. A light-emitting device according to claim 1,
wherein the third light emitting element further comprises a red emission dye.

5. A light-emitting device according to claim 1,
wherein the first light emitting element further comprises a reflector under one of the first pair of electrodes which is opposite to the first coloring layer.

6. A light-emitting device according to claim 1,
wherein the first light emitting element further comprises a hole transporting layer and an electron transporting layer with the first light emitting layer therebetween, and
wherein one of the first pair of electrodes which is closer to the first coloring layer has transmittance of from 50 to 95% for the wavelength of emission from the hole transporting layer.

7. The light-emitting device according to claim 1,
wherein the light-emitting device is used for a display portion of an electronic apparatus selected from the group consisting of TV set, video camera, computer, sound reproduction device, digital camera, and cellular phone.

8. A light-emitting device comprising:
a first thin film transistor, a second thin film transistor and a third thin film transistor formed over a substrate;
a first light emitting element which comprises a first light emitting layer interposed between a first pair of electrodes and is electrically connected to the first thin film transistor;
a second light emitting element which comprises the first light emitting layer interposed between a second pair of electrodes and is electrically connected to the second thin film transistor;
a third light emitting element which comprises a second light emitting layer interposed between a third pair of electrodes and is electrically connected to the third thin film transistor; and
a first coloring layer, a second coloring layer, and a third coloring layer provided over the first light emitting element, the second light emitting element, and the third light emitting element, respectively;
wherein the second light emitting element is adjacent to the first light emitting element and the third light emitting element;
wherein the first light emitting layer extends from the first light emitting element to the second light emitting element and is shared by the first light emitting element and the second light emitting element;
wherein the first coloring layer, the second coloring layer, and the third coloring layer are different in color from each other,
wherein the first light emitting layer and the second light emitting layer are different in emission color from each other, and
wherein the second light emitting layer overlaps an edge portion of the first light emitting layer.

9. A light-emitting device according to claim 8,
wherein the first light emitting element further comprises a hole transporting layer and an electron transporting layer with the first light emitting layer therebetween, and
wherein a total thickness of the hole transporting layer, the first light-emitting layer and the electron transporting layer is arranged to be equal to an integral multiple of a value that is obtained by dividing a wavelength of an emission peak of the hole transporting layer by refraction index of a layer consisting of the hole transporting layer, the first light emitting layer, and the electron transporting layer.

10. A light-emitting device according to claim 8,
wherein the first light emitting element is capable of emitting laser light.

11. A light-emitting device according to claim 8,
wherein the third light emitting element further comprises a red emission dye.

12. A light-emitting device according to claim 8,
wherein the first light emitting element further comprises a reflector under one of the first pair of electrodes which is opposite to the first coloring layer.

13. A light-emitting device according to claim 8,
wherein the first light emitting element further comprises a hole transporting layer and an electron transporting layer with the first light emitting layer therebetween, and
wherein one of the first pair of electrodes which is closer to the first coloring layer has transmittance of from 50 to 95% for the wavelength of emission from the hole transporting layer.

14. The light-emitting device according to claim 8,
wherein the light-emitting device is used for a display portion of an electronic apparatus selected from the group consisting of TV set, video camera, computer, sound reproduction device, digital camera, and cellular phone.

* * * * *